United States Patent [19]

Baertsch et al.

[11] 4,302,686
[45] Nov. 24, 1981

[54] CHARGE TRANSFER SERIAL-TO-PARALLEL CONVERTER

[75] Inventors: Richard D. Baertsch; William E. Engeler, both of Scotia, N.Y.

[73] Assignee: General Electric Company, Schenectady, N.Y.

[21] Appl. No.: 162,015

[22] Filed: Jun. 23, 1980

[51] Int. Cl.³ .................. G11C 19/28; H01L 29/78
[52] U.S. Cl. .............................. 307/221 D; 357/24
[58] Field of Search ................. 357/24; 307/221 D

[56] References Cited

U.S. PATENT DOCUMENTS 4,177,391 12/1979 Sunami et al. .................... 357/24
4,259,598 3/1981 Tiemann et al. ............... 307/221 D

FOREIGN PATENT DOCUMENTS 2004692 4/1979 United Kingdom ................ 357/24

Primary Examiner—Gene M. Munson
Attorney, Agent, or Firm—Julius J. Zaskalicky; Marvin Snyder

[57] ABSTRACT

A charge transfer device is described for the conversion of a sequence of samples of a signal occurring at high frequency into simultaneous data samples occurring at a substantially lower frequency and substantially longer duration.

6 Claims, 15 Drawing Figures

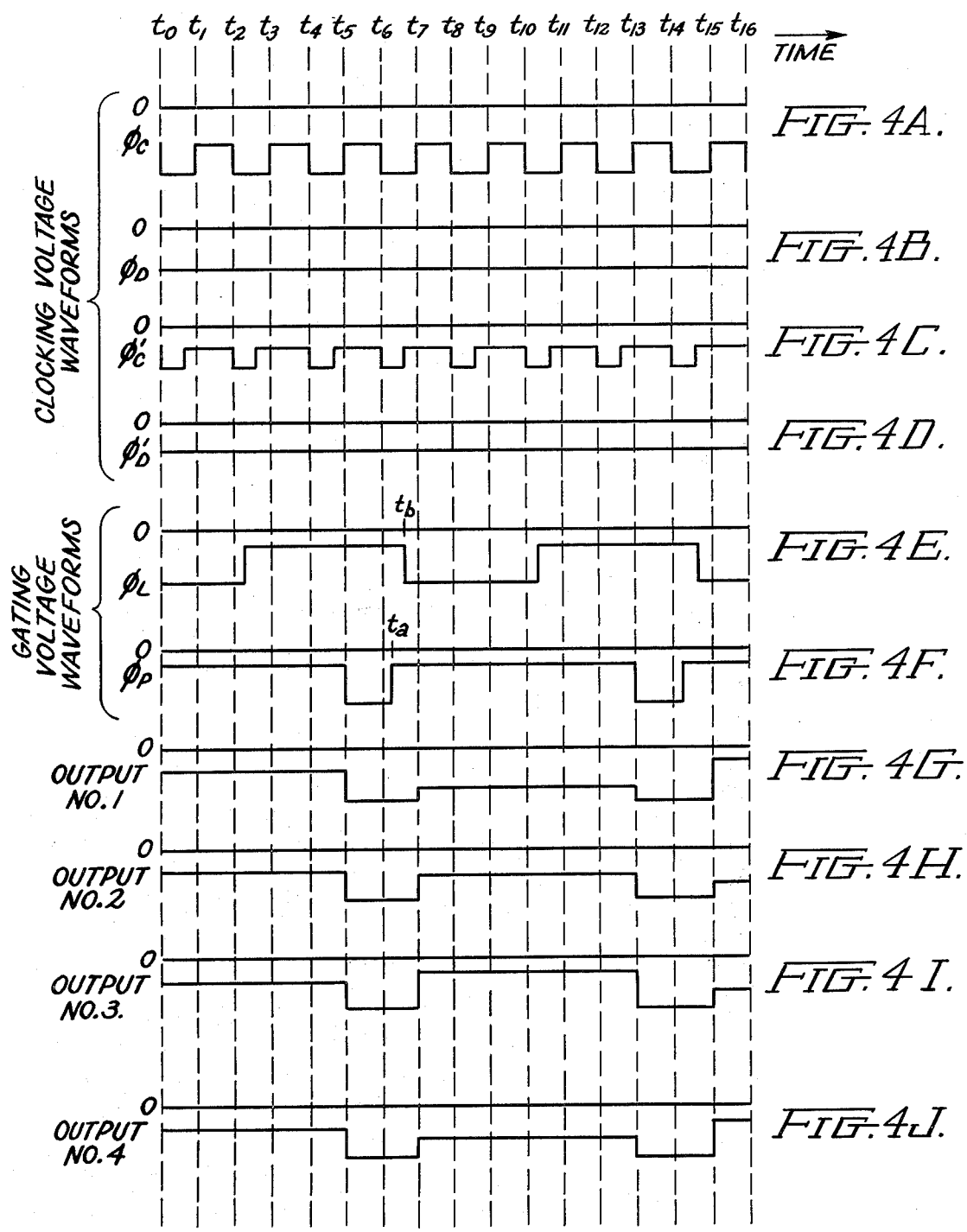

CHARGE TRANSFER SERIAL-TO-PARALLEL CONVERTER

The present invention relates to charge transfer apparatus for converting sequential samples of an analog signal into an array of parallel samples.

An object of the present invention is to provide apparatus for the conversion of a sequence of samples of a signal occurring a high frequency into simultaneous data samples occurring at a substantially lower frequency and substantially longer duration.

Another object of the present invention is to provide relatively simple apparatus for the conversion of a sequence of samples of a signal into simultaneous samples of substantially longer duration requiring a minimum of driving power.

In carrying out the invention in one illustrative embodiment thereof, there is provided a plurality of charge transfer shift registers formed in parallel on a semiconductor substrate and consecutively numbered from 1 to n, each shift register including a plurality of stages with the number of stages included in the shift registers varying linearly with shift register number with each successive shift register having a first fixed number of stages more than the preceding shift register. Means are provided for developing in succession first sequences of packets of charge, each sequence having n consecutive packets of charge, each packet representing a sample of an input signal. Means are provided for dividing in sequence each packet of charge of the first sequence into n second sequences of packets of charge. Means are provided for applying each second sequence of packets of charge to a respective shift register. Clocking means are provided for transferring charge in the shift registers from stage-to-stage thereof. A plurality of drain stages are provided, each coupled to an intermediate stage of a respective shift register. Each intermediate stage is spaced a second fixed number of stages from the last stage of a respective shift register. Means are provided for rendering the drain stages operative to drain all charges transferred into the intermediate stages over the clocking cycles of one of the second sequences except for an interval including at least one clocking cycle thereof, whereby during this interval at least one packet of charge in each of the shift registers is passed to successive stages thereof. Means are provided for sensing and detecting each of the packets of charge to develop simultaneously a plurality of outputs, each having an amplitude corresponding to the magnitude of a respective packet of a respective one of the second sequences.

The novel features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein:

FIGS. 4A through 4J show diagrams of voltage waveforms useful in explaining the operation of the apparatus of the present invention.

Figure 1:
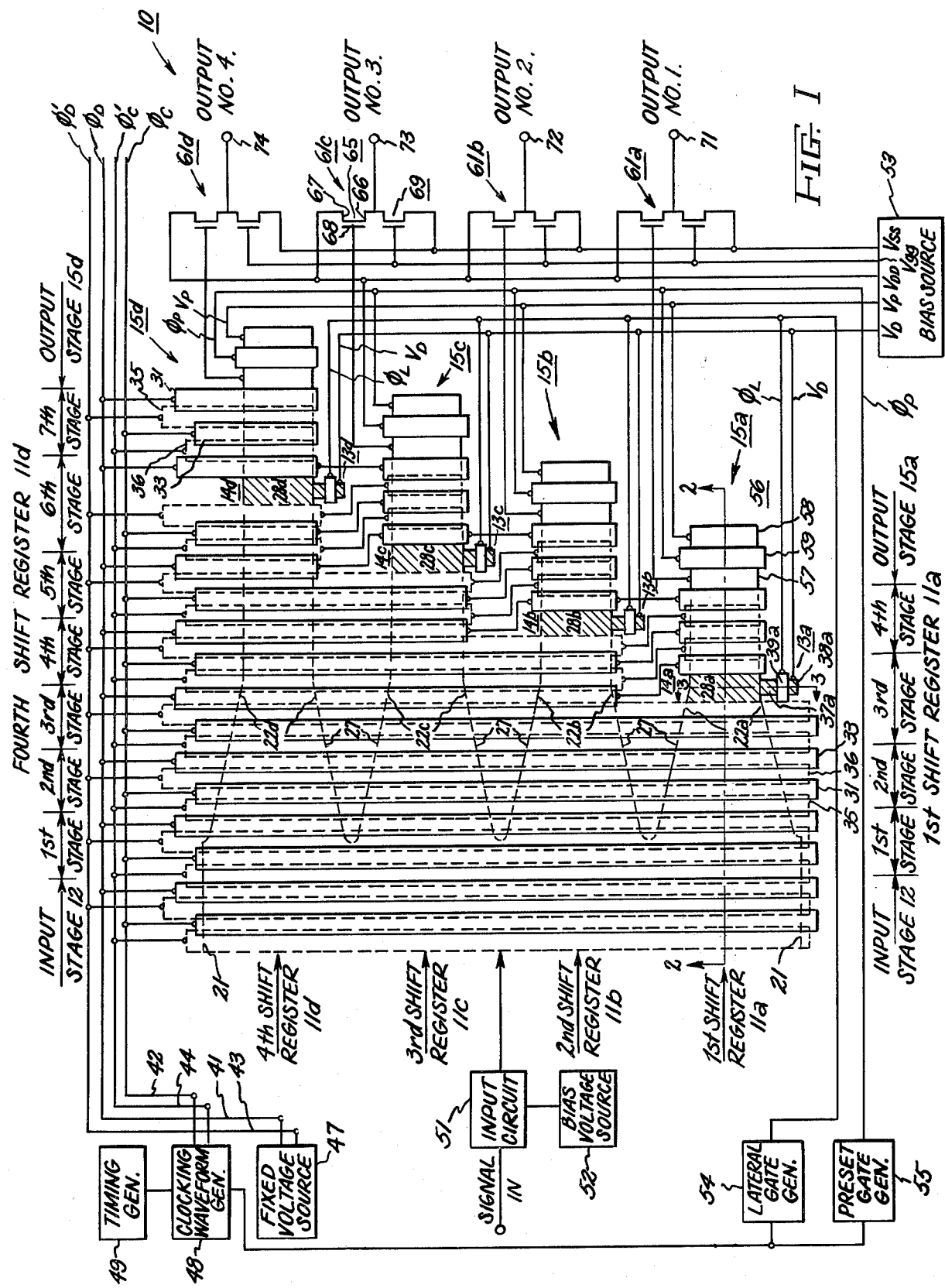
FIG. 1 is a schematic diagram of one embodiment of a charge transfer serial-to-parallel converter in accordance with the present invention.
Figure 2:
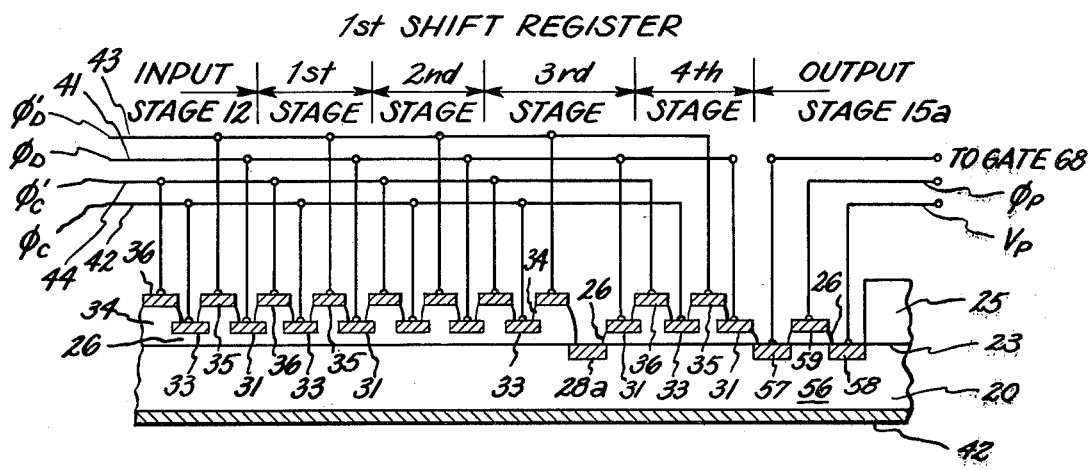
FIG. 2 shows a sectional view of the apparatus of FIG. 1 taken along section lines 2—2 of FIG. 1.
Figure 3:
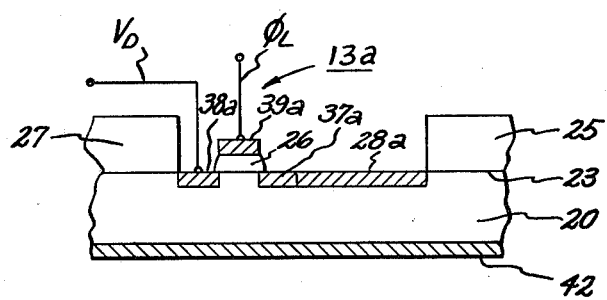
FIG. 3 shows a sectional view of the apparatus of FIG. 1 taken along section lines 3—3 of FIG. 1.

Reference is now made to FIGS. 1-3 which show apparatus 10 for the implementation of a serial-to-parallel converter in accordance with the present invention. The apparatus 10 comprises a plurality of n charge transfer shift registers 11a–11d, each including a plurality of charge storage and transfer stages formed on a common semiconductor substrate 20. For reasons of simplicity in illustrating and describing the converter, four shift registers 11a–11d, designated the first, second and fourth shift registers are shown having four, five, six and seven stages, respectively. An input stage 12 is provided coupled to the first stages of the shift registers 11a–11d. A plurality of drain stages 13a–13d are provided, each coupled to a respective one of intermediate stages 14a–14d of a respective one shift registers 11a–11d. The intermediate stages of the first through fourth shift registers are, respectively, the third through sixth stages thereof. A plurality of output stages 15a–15d are also provided, each coupled to a respective one of shift registers 11a–11d.

The shift registers 11a–11d and the input stage 12 are formed on a semiconductor substrate 20 of N-type conductivity which has a wide channel portion 21 over which the input stage 12 is formed and a plurality of narrow channel portions 22a–22d extending therefrom over which the four shift registers 11a–11d are formed. Typically, the substrate 20 may be silicon semiconductor of suitable resistivity, for example, 4 ohm-cm, having a major surface 23. Overlying the major surface 23 of the substrate is a thick insulating member 25 of silicon dioxide having a thin portion 26, for example 1000 Angstroms thick, lying in registry with the wide and narrow channel portions 21 and 22a–22d. A plurality of first parallel clock lines 31 is provided, each extending generally parallel to and insulatingly overlying first charge storage regions of the input stage 12 and of the stages of the shift registers 11a14 11d. The portion of lines 31 overlying the first storage region on the input stage 12 is wide and the portions of the lines 31 overlying the first storage regions of the stages of the shift registers 11a–11d are narrow. The width of the first charge storage region of each of the first stages of the shift registers 11a–11d is the same and is equal to substantially one-fourth of the width of the first charge storage region of the input stage 12. Thus, in the transfer of a charge packet from the first charge storage region of the input stage 12 into the first charge storage regions of the first stages of the shift registers 11a–11d a division of the charge packet into four equal charge packets is obtained, as will be more fully described below. The first charge storage regions of the first stages of the shift registers 11a–11d are implemented by respective blocks 27 of thick insulation over which the lines 31 pass. Each of the blocks 27 start at a point just in front of the leading edge of a line 31 and tapers in both directions laterally to a constant width. A plurality of second parallel lines 33 is provided, each parallel to the lines 31 and interleaved therebetween. The portions of the substrate in the channel portions 22a–22d underlying these conductors are designated the second charge storage cells. Each of the lines 31 is of uniform length in the direction of the charge transfer in the channels. Similarly, each of the second lines 33 is of uniform length dimension in the direction of the charge transfer in the channels. The lines 31 and the lines 33 are spaced apart by a distance equal to or less than the length of a line 31. Another thin layer of insulation 34 (FIG. 2), for example 1000 Angstroms thick, is provided overlying the first and second parallel lines 31 and 33. A plurality of third parallel lines 35 is provided overlying the insulating layer 34. Each of the third lines 35 is insulatingly spaced between a respective first line 31 and a respective preceding second line 33. The third lines 35 overlie both the first lines 31 and second lines 33. A plurality of fourth parallel lines 36 is also provided overlying the insulating layer 34. Each of the fourth lines 36 is insulatingly spaced between a respective second line 33 and a respective preceding first line 31. The fourth lines 36 overlie both the second and first lines. The third and fourth lines 35 and 36 are shown in dotted outline to illustrate with clarity the structure and organization of the apparatus. The portions of four successive lines 31, 33, 35 and 36 insulatingly overlying channel portion 21 constitutes the electrodes of the input stage 12. The portions of a set of four successive lines 31, 33, 35 and 36 insulatingly overlying channel portion 22a constitute the electrodes of a stage of the shift registers 11a. The portions of a set of four successive lines 31, 33, 35 and 36 insulatingly overlying channel portion 22b constitute the electrodes of a stage of the shift register 11b, and so for shift registers 11c and 11d.

The intermediate stages of the shift registers 11a-11d (the third stage for the first shift register, the fourth stage for the second shift register and so on) include in addition respective regions 28a-28d of opposite conductivity type in the channel portion of the substrate between the third line 35 and the succeeding first line 31 of the stage.

The portions first line 31 overlying the first storage regions are designated as $\phi_D$ electrodes and are connected to a common line 41 which is connected to a source 47 of $\phi_D$ voltage. The portions of the second lines 33 overlying the second storage regions are designated as $\phi_C$ electrodes and are connected to a common line 42 which is connected to a source 48 of $\phi_C$ clocking voltage. All of the third lines 35 which overlie the leading or input edge of the first storage regions are designated $\phi_D'$ electrodes and are connected to a common line 43 which is connected to source 47 of $\phi_D'$ voltage. All of the fourth lines 36 which overlie a leading or input edge of the second storage regions are designated as $\phi_C'$ electrodes and are connected to a common line 44 which is connected to source 48 of $\phi_C'$ voltage. A conductive layer 42 of a suitable material such as gold is eutectically bonded to the lower surface of the substrate 20 to provide a substrate contact to which the ground line of the $\phi_D$, $\phi_D'$, $\phi_C$ and $\phi_C'$ voltage sources are connected.

The manner in which packets of charge are clocked into the shift register 11, transferred from stage to stage along the shift register and processed therein will now be described in connection with the waveform diagrams of FIGS. 4A-4D, which shows the clocking waveform voltages $\phi_D$, $\phi_C$, $\phi_D'$ and $\phi_C'$, which are applied respectively to lines 41-43. Each stage of the shift registers 11a-11d and also the input stage 12 includes a $\phi_D$ storage region (first storage region) underlying a $\phi_D$ line 31 and a $\phi_C$ storage region (second storage region) underlying a $\phi_C$ line 33. The $\phi_D$ voltage applied to the $\phi_D$ line 31 is fixed. The $\phi_C$ voltage applied to the $\phi_C$ line cycles between a high level and a low level above and below the $\phi_D$ voltage. When the $\phi_C$ voltage is at its high level charge transfer is enabled from the $\phi_C$ region to the $\phi_D$ region, and conversely when the $\phi_C$ voltage is at its low level charge transfer from the $\phi_D$ storage region cell to the $\phi_C$ storage region is enabled. Each stage also includes a $\phi_D'$ line 35 to which is applied a $\phi_D'$ voltage of fixed value which produces a surface potential in the substrate underlying the electrode which is smaller in absolute magnitude than the surface potential underlying a $\phi_D$ line. Each stage also includes a $\phi_C'$ voltage having two levels. At the upper level a surface potential is produced in the substrate underlying the electrode which inhibits the transfer of charge from a $\phi_D$ storage cell to a $\phi_C$ storage cell. At the lower level a surface potential is produced enabling the transfer of charge from a $\phi_D$ storage region to a $\phi_C$ storage region. Thus, when the $\phi_C$ voltage is at its high level, charge is transferred from a $\phi_C$ storage region to a $\phi_D$ storage region, and when both the $\phi_C$ voltage and the $\phi_C'$ voltage are at their low levels, charge is transferred from a $\phi_D$ storage region to a $\phi_C$ storage region. For each cycle of the clocking voltages $\phi_C$ and $\phi_C'$, charge is transferred from a $\phi_C$ storage region to a $\phi_D$ storage region and then to the next succeeding $\phi_C$ storage region.

Input circuit 51 is provided for generating packets of charge representing samples of a time-varying analog signal. Such input circuits are well-known in the art, one of which is described in connection with FIGS. 8A, 8B and 8C in the U.S. Pat. No. 4,032,867, assigned to the assignee of the present invention and incorporated herein by reference thereto. This particular circuit is referred to as a "fill and spill" circuit. Of course, other input circuits may be utilized. A bias voltage source 52 connected to the input circuit provides a fixed bias charge component to each input packet of charge to facilitate the transfer thereof and also when desired to accommodate both negative as well as positive signal samples. When the bias source is used, if a signal sample is positive a corresponding signal related charge is added to the fixed bias charge to constitute the input packet, and conversely if the signal sample is negative a corresponding signal related charge is subtracted from the fixed bias charge to constitute the input packet. Thus, the packet of charge applied to the input of the shift register is the algebraic sum of the fixed bias charge and the signal related charge.

Each of drain stages 13a-13d comprises a region of opposite conductivity type constituting a source region 37a and another region of opposite conductivity type in the substrate adjacent the major surface constituting a drain region 38a. Adjacent linear edges of source and drain regions are parallel and form a short channel region therebetween adjacent the major surface. A gating electrode is provided insulatingly overlying and in registry with the channel region. The source regions 37a-37d of respective drain stages 13a-13d are connected to respective regions 28a-28d of opposite conductivity type. The drain regions 38a-38d of the respective drain stages 13a-13d are connected to a source 53 providing drain potential $V_D$. The gating electrodes 39a-39d of the respective drain stages 13a-13d are connected to the lateral gate generator 54 providing gating voltage $\phi_L$ (FIG. 4E). The voltage $\phi_L$ over a portion of a cycle thereof cause a conduction channel to be established in the channel region between the source and drain regions.

Packets of charge transferred in each of the shift registers 11a-11d are sensed at a respective one of output stages 15a-15d connected as precharge and float circuits. Each output stage comprises a transistor 56 having a source electrode 57, a drain electrode 58 and a gate electrode 59. The source electrode 57 is a region of opposite conductivity type and the drain electrode 58 is another region of opposite conductivity type in the substrate 20 adjacent the major surface 23. Each source region lies in a respective channel portion of the substrate and is contiguous with a respective first charge storage region of the last stage of a shift register. Each drain region also lies in a respective channel portion. The gate electrode 59 insulatingly overlies and is in registry with a part of the channel portion between the source and drain regions. A drain potential $V_p$ is applied to drain electrode 58 from a bias source 53. A gating potential $\phi_p$ (FIG. 4F) is applied to gate electrode 59 from preset gate generator 55. The voltage $V_p$ is set to lie between the extreme values of the voltage $\phi_p$. When the voltage $\phi_p$ is at its low level, the transistor 56 is turned on and the source or output node 57 is charged to the potential $V_p$. When the voltage $\phi_p$ is at its high level the transistor 56 is turned off and output node 57 floats. Any charge transferred to the output node 57 while it is floating causes a change in potential thereof proportional to the magnitude of the charge.

The change in potential of the output nodes 57 of each of the output stages 15a-15d is applied to a respective one of output circuits 61a-61d from which parallel outputs, such as shown in respective FIGS. 4G-4J are obtained. Each output circuit includes a first transistor 65 having a source electrode 66, a drain electrode 67, and a gate electrode 68 connected as a source follower circuit in which a second transistor 69 provides the load therefore. The output nodes 57 are connected to gates 68 of respective transistors 65. The drain electrodes 67 of transistors 65 are supplied with drain voltage $V_{DD}$ from bias source 53. The source electrodes 66 of transistors 65 are connected through the drain-to-source conduction path of transistor 69 acting as a source load to potential $V_{SS}$ provided by bias source 53. The gates of transistor 69 are connected to bias voltage $V_{gg}$ provided by bias source 53 to maintain substantially constant current flow in transistors 65 and 69. Under this condition the gate-to-source potential difference of each of transistors 65 is maintained substantially constant as the voltage on the gate thereof varies in response to voltage sensed on the respective output node. Thus the potential of each of source electrodes 66 follows the potentials of the gate thereof. Output terminals 71-74 are connected to source electrodes 66 of respective output circuits 61a-61d to provide outputs, such as shown in respective FIGS. 4G-4J.

The function of the apparatus of FIGS. 1-3 is to convert a sequence signal samples occurring in series into a sequence of signal samples occurring simultaneously. In the specific embodiment shown, which includes four shift registers, the apparatus will convert a sequence of four samples ($P_1$, $P_2$, $P_3$, $P_4$) of short duration occurring in series into four samples $Q_1$, $Q_2$, $Q_3$, $Q_4$ occurring simultaneously, or in parallel, each having a level corresponding to the level of a respective one of the samples of the serial sequence and four times the duration thereof.

Assume that such a sequence of four packets is developed by the input circuit 57 and applied to the input stage 12. During the first half of an initial clock cycle $t_0-t_1$, the initial packet of charge is transferred to a second stage region underlying a $\phi_c$ electrode of the input stage. During the interval $t_1-t_2$ the initial charge packet is transferred to the first storage region of the input stage 12. During the first half of the next clock cycle the initial packet is transferred into the second storage region of the first stages of the shift registers 11a-11d which is common to all of the first stages. During the second half of this cycle the initial packet is split or divided into four equal parts, each part being transferred into the first storage region of a respective first stage. In successive clocking cycles each divided initial packet is transferred from stage-to-stage of a respective one of the four shift registers 11a-11d. Successive packets of a succeeding sequence undergo identical division except four clock cycles later.

Referring now to FIGS. 4A-4J and assume that during the interval $t_1-t_2$ charge packets $P_3$ and $P_4$ are delivered and stored in the first storage regions of respective second and first stages of the first shift register 11a.

At time $t_2$, the voltage $\phi_c$ drops and the packets $P_3$ and $P_4$ move from first charge storage regions of respective second and first stages to the second charge storage regions of the third or intermediate stage and the second stage, respectively.

Just after $t_2$, the lateral gate voltage $\phi_L$ (FIG. 4E) rises and turns off the drain stage 13a and hence drainage of charge transferred to region 28a of opposite conductivity type of the first storage region of the third stage, conveniently referred to as the intermediate node, ceases.

At time $t_3$, the voltage $\phi_c$ rises and the packet $P_3$ moves to the intermediate node 28a of the third stage. As the turn-off of the drain stage 13a leaves the potential of the intermediate node 28a at a value other than the potential of the first storage region underlying the $\phi_D$ electrode thereof, some of the charge packet $P_3$ will be left behind to equalize these potentials when the packet $P_3$ is transferred to the next stage. Thus packet $P_3$ is degraded and cannot be used for sensing potentials and hence will be discarded. Packet $P_4$ is not degraded and will be sensed, as will be described below to provide a level corresponding thereto. Also, at $t_3$, the packet $P_4$ is transferred to the first charge storage region of the second stage.

At time $t_4$, the voltage $\phi_c$ drops and the transfer of packet $P_3$ to the second storage region of the fourth stage is initiated. Also at $t_4$, the transfer of packet $P_4$ to the second storage region of the third stage is initiated.

At time $t_5$, the preset gate voltage $\phi_p$ (FIG. 4F) is lowered turning on output stage 15a and connecting source region 57 of opposite conductivity type, referred to as the output node, to potential $V_p$. Also at $t_5$, the voltage $\phi_c$ rises and the transfer of packet $P_3$ to the output node 57 is initiated. As output node 57 is connected to drain electrode 58, the packet $P_3$ flows into the drain region of this stage and disappears. Also at $t_5$, the transfer of packet $P_4$ to the first storage region of the third stage or intermediate node 28a is initiated.

At time $t_6$, the voltage $\phi_c$ drops and the transfer of packet $P_4$ to the second charge storage region of fourth stage is initiated.

At time $t_a$, in the interval $t_6-t_7$, the preset gate voltage $\phi_p$ rises turning off the output stage 15a thereby allowing the output node 57 to float.

At time $t_b$, also in the interval $t_6-t_7$, but subsequent to $t_a$, the lateral gate voltage $\phi_L$ drops, turning on the drain stage 13a thereby draining subsequent packets of charge transferred in the first shift register 11a and hence inhibiting their passage to the fourth stage of the first shift register.

At time $t_7$, the voltage $\phi_c$ rises and the packet $P_4$ is transferred to the output node 57 which is now floating and develops a voltage level proportional to the packet $P_4$. The output node 57 is maintained at this level until the preset gating stage is again activated at time $t_{13}$ in preparation for detection of the corresponding packet of the next sequence of packets.

In the second, third and fourth shift registers, the operation is identical except that the packet detected at the output nodes 57 of these shift registers are packets $P_3$, $P_2$ and $P_1$, respectively, and provide voltage levels corresponding thereto. The voltage levels appearing on the output nodes 57 of the first through fourth shift registers are applied to the gates of respective source followers 61a–61d from which output nos. 1–4, respectively, are obtained as shown in FIGS. 4G–4J, respectively. Output levels derived for charge packets $P_1$, $P_2$, $P_3$ and $P_4$ are maintained during subsequent clock periods as subsequent charge packets reaching the intermediate stages are drained through the drain stage and do not reach the output stage. The output levels appearing on the output terminals 71–74 may be held or updated during subsequent sequence periods in the same manner as described above thereby providing data samples of substantially lower frequency and substantially longer duration.

Figure 5A:
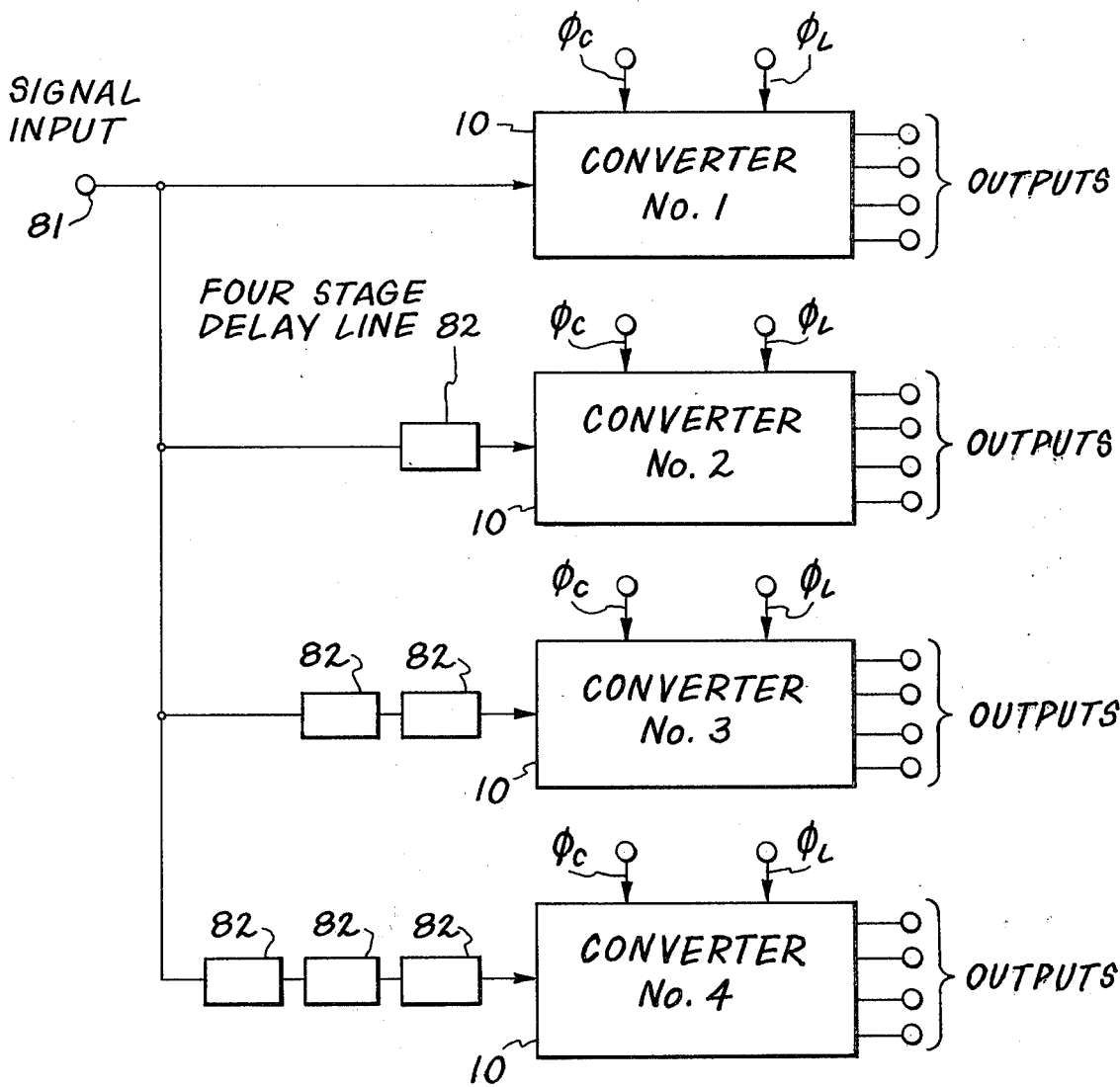
FIG. 5A shows a block diagram of apparatus including a plurality of converters such as shown in FIG. 1.
Figure 5B:
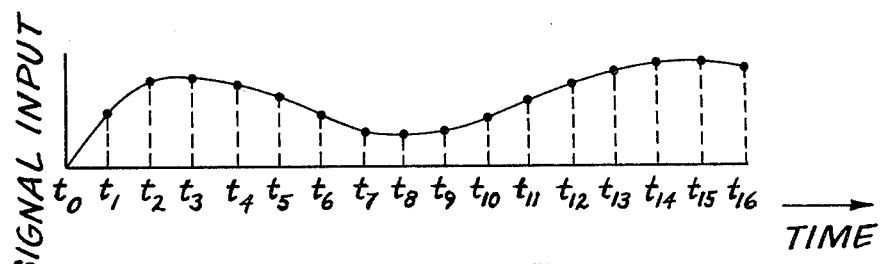
FIG. 5B shows a diagram of an input signal useful in explaining the operation of the apparatus of FIG. 5A.

Reference is now made to FIG. 5A which shows a block diagram of apparatus including a plurality of converters 10 such as shown in FIG. 1 for converting a sequence of a large number of signal samples occurring at high frequency into simultaneous data samples, each of substantially longer duration than the duration of the portion of the sequence converted by a single converter. The apparatus includes four converters 10, each having an input circuit and four output terminals. The apparatus also includes an input terminal 81 to which a voltage signal is applied. The input of converter No. 1 is connected directly to input terminal 81. The input of converter No. 2 is connected through a single four-stage delay line 82 to the input terminal 81. The input of converter No. 3 is connected through two four-stage delay lines 82 to the input terminal 81. The input of converter No. 4 is connected through three four-stage delay lines 82 to the input terminal 81. For the apparatus of FIG. 5A a sequence of sixteen packets of charge, such as shown in FIG. 5B, would be applied to each converter 10 successively delayed by four clock periods. The frequency of the clocking waveforms $\phi_C$ and $\phi_C 40$ utilized would be the same as the sampling frequency of the sequence. The lateral gating waveform $\phi_L$ applied to all of the converters would disable the drain stages of all of the shift registers of all of the converters over the same two successive clocking periods. Thus, at the output terminals of the converters sixteen levels of output, each corresponding to a respective input sample would be obtained. Each output level would have a duration substantially longer than the duration of the sequence of samples applied to a single converter. While the above embodiment is described in terms of a monolithic structure, other delay means may be utilized.

While in the embodiment of the invention described, one stage is included between the intermediate stage and the output stage of each of the shift-registers, it will be understood that two or more stages may be used, if desired.

While in the embodiment of the invention described each successive shift register has one more stage than the preceding shift register, it will be understood that two or more stages may be used, if desired. For example, when each successive shift register has two more stages than the preceding shift register, the output levels appearing at the output terminals 71–74 would represent even numbered samples of the input signal. Use of another such converter with each shift register thereof having an additional stage would provide output levels at the output terminals thereof representing odd numbered samples of the input signal.

While in the embodiment of FIG. 1, a first sequence of n packets is developed by the input circuit 51 and applied to the input stage 12, and thereafter the first sequence is divided into n second sequences of n packets wherein corresponding packets of the second sequences are equal, it will be understood that the corresponding packets of the second sequences can be made different, if desired, by simply making the channel widths of the shift registers different.

While in the embodiment of FIG. 1, a first sequence of n packets is developed by the input circuit 51 and applied to the input stage 12, and thereafter the first sequence of n packets is divided into n second sequences of n packets, it will be understood that n input circuits could have been utilized to provide n sequences of n packets of charge with each of the n sequences applied directly to a respective shift register.

While the interval of the waveform $\phi_L$ of FIG. 4E has been shown as having a high level portion over substantially two clock periods to render the drain stages 13a–13d inoperative to drain charges transferred to the intermediate stages 14a–14d of the shift registers 11a–11d, it is apparent that where degradation of the charge packets can be tolerated or is not important, an interval of substantially a single clock period can be utilized.

While the invention has been described in connection with a converter in which four shift registers are provided, it is apparent any number of shift registers with corresponding outputs may be utilized.

While the invention has been described in a specific embodiment, it will be understood that modifications, such as those described above, may be made by those skilled in the art, and it is intended by the appended claims to cover all such modifications and changes as fall within the true spirit and scope of the invention.

What we claim as new and desire to secure by Letters Patent of the United States is:

1. A serial-to-parallel converter comprising:
  a plurality of charge transfer shift registers formed in parallel on a semiconductor substrate and consecutively numbered 1 to n, each shift register including a plurality of stages with the number of stages included in said shift registers varying linearly with shift register number with each successive shift register having a first fixed number of stages more than the preceding shift register,
  transducer means for developing n pluralities of a sequence of n packets of charge, the packets of charge in each plurality representing successive samples of an input signal,
  means for applying each of said pluralities of packets to a respective one of said plurality of shift registers, each packet of a plurality being applied to a respective shift register in sequence, clocking means for transferring charge in said shift registers from stage-to-stage thereof, a plurality of drain stages, each coupled to an intermediate stage of a respective shift register, each intermediate stage being spaced a second fixed number of stages from the last stage of a respective shift register, means for rendering said drain stages operative to drain all charges transferred into said intermediate stages over the clocking cycles of a sequence of said pluralities except for an interval including at least one clocking cycle thereof, whereby during said interval at least one packet of charge in each of said shift registers is passed to successive stages thereof, means for detecting each of said packets of charge to develop simultaneously a plurality of outputs, each having an amplitude corresponding to the magnitude of a respective sample of said input signal.

2. The converter of claim 1 in which said first fixed number of stages is one.

3. The converter of claim 1 in which said first fixed number of stages is two.

4. The converter of claim 1 in which the corresponding packets of charge in each plurality of packets developed by said transducer means and representing a respective sample of said input signal are equal.

5. The converter of claim 1 in which said interval over which said drain stages are inoperative in draining charges transferred into said intermediate stages is equal to substantially two clocking cycles of a sequence of said n pluralities of n packets of charge.

6. A serial-to-parallel converter comprising:

a plurality of charge transfer shift registers formed in parallel on a semiconductor substrate and consecutively numbered from 1 to n, each shift register including a plurality of stages with the number of stages included in said shift registers varying linearly with shift register number with each successive shift register having a first fixed number of stages more than the preceding shift register, means for developing a first sequence of packets of n consecutive packets of charge, each packet representing a sample of an input signal, means for dividing each packet of charge of said first sequence into n packets of charge to form n second sequences of packets of charge, means for applying each packet of charge of said second sequence to a respective shift register, clocking means for transferring charge in said shift registers from stage-to-stage thereof, a plurality of drain stages, each coupled to an intermediate stage of a respective shift register, each intermediate stage being spaced a second fixed number of stages from the last stage of a respective shift register, means for rendering said drain stages operative to drain all charges transferred into said intermediate stages over the clocking cycles of one of said second sequences except for an interval including at least one clocking cycle thereof, whereby during said interval at least one packet of charge in each of said shift registers is passed to successive stages thereof, means for detecting each of said packets of charge to develop simultaneously a plurality of outputs, each having an amplitude corresponding to the magnitude of a respective packet of a respective one of said second sequences.

* * * * *